(12) United States Patent
Crippa et al.

(10) Patent No.: US 11,828,774 B2
(45) Date of Patent: Nov. 28, 2023

(54) TESTING HEAD WITH IMPROVED FREQUENCY PROPERTY

(71) Applicant: TECHNOPROBE S.p.A., Cernusco Lombardone (IT)

(72) Inventors: Roberto Crippa, Cernusco Lombardone (IT); Flavio Maggioni, Cernusco Lombardone (IT)

(73) Assignee: TECHNOPROBE S.p.A., Cernusco Lombardone (IT)

( * ) Notice: Subject to any disclaimer, the term of this patent is extended or adjusted under 35 U.S.C. 154(b) by 0 days.

(21) Appl. No.: 16/550,071

(22) Filed: Aug. 23, 2019

(65) Prior Publication Data

US 2019/0377005 A1     Dec. 12, 2019

Related U.S. Application Data

(63) Continuation-in-part of application No. PCT/EP2018/054329, filed on Feb. 22, 2018.

(30) Foreign Application Priority Data

Feb. 24, 2017   (IT) .......................... 102017000021397

(51) Int. Cl.
    *G01R 1/073*      (2006.01)
    *G01R 1/067*      (2006.01)
(52) U.S. Cl.
    CPC ..... *G01R 1/07371* (2013.01); *G01R 1/06761* (2013.01)
(58) Field of Classification Search
    CPC ............ G01R 1/07371; G01R 1/06761; G01R 1/07357; G01R 3/00; G01R 1/06772;
    (Continued)

(56) References Cited

U.S. PATENT DOCUMENTS 7,950,927 B2 *   5/2011   Kazama .................. G01R 3/00
                                                    439/66
8,994,393 B2     3/2015   Ding et al.
                (Continued)

FOREIGN PATENT DOCUMENTS

CN            1550237 A      12/2004
CN          102384991 A       3/2012
                (Continued)

OTHER PUBLICATIONS

English machine translation of Ito JP 2014112046 (Ito) (Year: 2014).*

*Primary Examiner* — Lee E Rodak
(74) *Attorney, Agent, or Firm* — SEED INTELLECTUAL PROPERTY LAW GROUP LLP

(57) ABSTRACT

A testing head comprises a plurality of contact probes, and a guide having a plurality of guide holes for housing the contact probes and including a conductive portion. Each contact probe includes a first end region and a second end region, and a body which extends between the first and second end regions. Suitably, the conductive portion includes a group of the guide holes and electrically connects contact probes of a first group of the contact probes. The contact probes of the first group slide in the guide holes in the conductive portion and are adapted to carry a same signal, and each contact probe of a second group of the plurality of contact probes is surrounded by an insulating coating layer that extends along the body of each contact probe of the second group, thereby insulating the contact probes of the second group from the conductive portion.

25 Claims, 9 Drawing Sheets

(58) Field of Classification Search
CPC .............. G01R 1/07314; G01R 1/0675; G01R
1/07378; G01R 1/0466; G01R 1/06711;
G01R 1/07307; G01R 1/07342; G01R
1/0483; G01R 1/067; G01R 1/06722;
G01R 1/06733; G01R 31/2886; G01R
1/045; G01R 1/06727; G01R 1/06755;
G01R 1/07364; G01R 1/07392; G01R
1/18; G01R 1/36; G01R 1/44; G01R
31/2601; G01R 31/31905
See application file for complete search history.

(56) References Cited

U.S. PATENT DOCUMENTS

| | | | |
|---|---|---|---|
| 2007/0200584 A1 | 8/2007 | Ku | |
| 2008/0054918 A1* | 3/2008 | Lin | G01R 1/06772 324/756.03 |
| 2008/0139017 A1 | 6/2008 | Kiyofuji et al. | |
| 2009/0212801 A1 | 8/2009 | Ku et al. | |
| 2012/0242360 A1 | 9/2012 | Huang et al. | |
| 2014/0062519 A1* | 3/2014 | Ding | G01R 1/07357 324/755.06 |
| 2014/0197860 A1* | 7/2014 | Hsu | G01R 1/07357 324/756.07 |
| 2014/0324384 A1 | 10/2014 | Gay et al. | |
| 2015/0198632 A1* | 7/2015 | Kim | G01R 1/07342 324/750.25 |
| 2015/0309074 A1 | 10/2015 | Kuo et al. | |
| 2016/0274147 A1* | 9/2016 | Hsu | G01R 1/07378 |
| 2016/0305980 A1 | 10/2016 | Misuo | |

FOREIGN PATENT DOCUMENTS

| | | | |
|---|---|---|---|
| CN | 106165213 A | 11/2016 | |
| CN | 212514719 U | 2/2021 | |
| EP | 0180013 A1 * | 5/1986 | ......... G01R 1/07378 |
| JP | H11248745 A | 9/1999 | |
| JP | H11248747 A | 9/1999 | |
| JP | 2004138452 A | 5/2004 | |
| JP | 2006084450 A | 3/2006 | |
| JP | 2007171138 A | 7/2007 | |
| JP | 2007178165 A | 7/2007 | |
| JP | 2008070146 A | 3/2008 | |
| JP | 2008145238 A * | 6/2008 | ......... G01R 1/07371 |
| JP | 2010139479 A | 6/2010 | |
| JP | 2010237133 A | 10/2010 | |
| JP | 2012159422 A | 8/2012 | |
| JP | 2014112046 A * | 6/2014 | ......... G01R 1/07357 |
| JP | 2014112046 A | 6/2014 | |
| JP | 2018048838 A | 3/2018 | |
| KR | 19990013617 A | 2/1999 | |
| KR | 20140003761 A | 1/2014 | |
| KR | 101421051 B1 | 7/2014 | |
| KR | 101467383 B1 | 12/2014 | |
| KR | 20160076967 A | 7/2016 | |
| TW | 201111796 A | 4/2011 | |
| TW | 201629493 A | 8/2016 | |
| TW | 201643441 A | 12/2016 | |

* cited by examiner

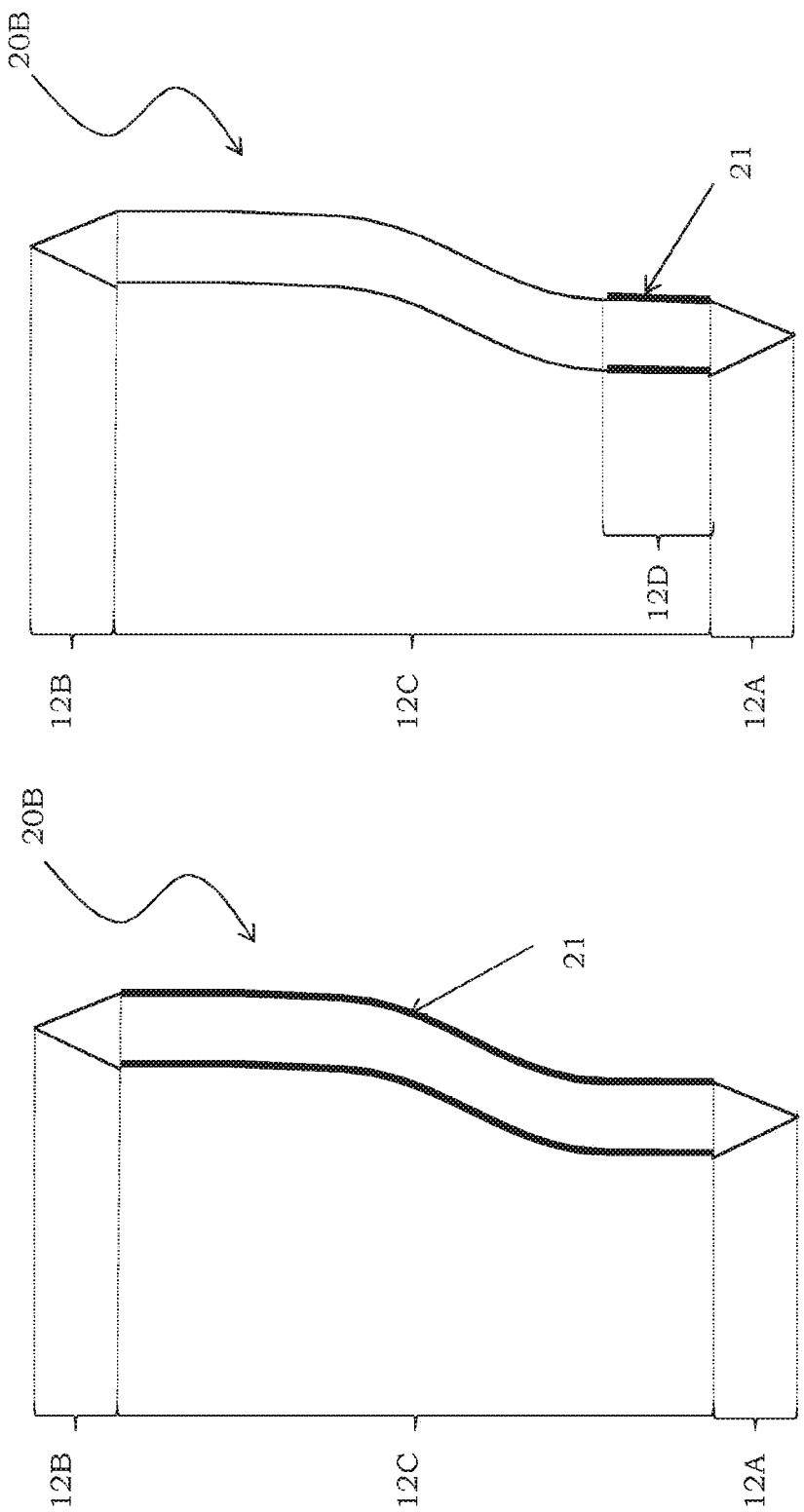

TESTING HEAD WITH IMPROVED FREQUENCY PROPERTY

BACKGROUND

Technical Field

The present disclosure refers to a testing head for testing electronic devices that are integrated on a semiconductor wafer and the following disclosure is made with reference to this field of application with the sole aim of simplifying the presentation thereof.

Description of the Related Art

As it is well known, a testing head is a device adapted to electrically connect a plurality of contact pads of a microstructure, in particular an electronic device that is integrated on wafer, with corresponding channels of a testing apparatus that performs the functionality testing, in particular electric, thereof, or the test, generically.

The test, which is performed on integrated devices, is particularly useful in detecting and isolating defective circuits as early as in the production phase. Normally testing heads are therefore employed for the electric test of devices that are integrated on wafers before cutting or singulation and assembling them inside a chip containment package.

A testing head includes a plurality of movable contact elements or contact probes provided with at least one end region or a contact tip for a corresponding plurality of contact pads of a device under test, also indicated by DUT (English acronym: "Device Under Test"). With the terms end or tip, it is hereinafter indicated an end region, not necessarily sharp.

It also known that the effectiveness and the reliability of a measuring test also depends, among the other factors, on the formation of a good electrical connection between device and testing apparatus, and therefore, on the formation of an optimal electrical contact probe/pad.

Among the types of testing heads used in the field of technology considered herein for testing the integrated circuits, the testing heads called as with vertical probes and indicated by the English term "vertical probe head" are commonly used.

A testing head with vertical probes comprises a plurality of contact probes retained by at least one pair of plates or guides, substantially plate-shaped and parallel to each other. Such guides are provided with suitable housing guide holes of the contact probes and are placed at a certain distance from each other so as to leave a free space or air gap for the movement and possible deformation of the contact probes. The pair of guides comprises in particular an upper guide or upper die and a lower guide or lower die, both provided with guide holes within which the contact probes axially slide, which are usually made of wires of special alloys with good electric and mechanical properties.

Good connection between the contact probes and the contact pads of the device under test is ensured also in this case by the pressure of the testing head on the device itself, the contact probes, being mobile within the guide holes realized in the upper and lower guides, undergoing, during such pressing contact, a bending inside the air gap between the two guides, and a sliding inside such guide holes.

It is also known the use of testing heads with not fixedly constrained probes, but held interfaced to an interface, also connected to the testing apparatus: they are referred to as testing heads with not blocked probes.

In this case, the contact probes also have a further end region or contact head towards a plurality of pads or contact pads of such interface. Good electric connection between probes and interface is ensured analogously to the contact with the device under test by pressing the probes onto the contact pads of the interface.

FIG. 1 schematically illustrates a testing head with not constrained vertical probes, globally indicated by 1.

The testing head 1 comprises therefore a plurality of contact probes 2 housed in at least one upper guide 3, usually indicated by "upper die", and a lower guide 4, usually indicated by "lower die", plate-shaped and parallel to each other, separated by an air gap 7. The upper guides 3 and lower guides 4 comprise respective guide holes 3A and 4A within which the contact probes 2 slide.

Each contact probe 2 has an end area or region ending with a contact tip 2A intended to abut onto a respective pad or contact pad 6A of a plurality of contact pads of a device under test 6 integrated on a semiconductor wafer, so as to realize a mechanical and electric contact between the device under test 6 and a testing apparatus (not shown) which such testing head is an end element of.

In the example of FIG. 1, each contact probe 2 also has a further end area or region ending with a so-called contact head 2B towards a respective pad or contact pad 5A of a plurality of contact pads of a space transformer 5. Good electric connection between contact probes 2 and space transformer 5 is ensured by pressing-abutting the contact heads 2B of the contact probes 2 onto the contact pads 5A of the space transformer 5 analogously to the contact between the contact tips 2A of the contact probes 2 with the contact pads 6A of the device under test 6.

As it is well known, the testing heads comprise many contact probes, increasingly closer, for carrying operating signals, in particular for carrying out tests on the integrated device, but also for carrying the power and ground signals.

Generally, within a testing head, the contact probes are divided into probes intended to carry power signals, probes intended to carry signals and probes intended to carry operating signals, in particular input/output signals between the testing apparatus and the device under test.

It is known that the presence of many contact probes intended to carry ground signals, so as the presence of many contact probes intended to carry power signals, creates interference, resulting therefore in a noise in the operating signals, that is in the input/output signals used for testing the device under test, carried by probes adjacent to the probes carrying the power and ground signals, that limits the frequency performance of the testing head as a whole. In case of contact probes intended to carry ground signals, disadvantageous ground loops can also arise.

Furthermore, the need to short-circuit two or more contact pads of the device under test arises. The most used known solution, known in the field by the name look-back, short-circuits two contact pads of the device under test via two probes of the testing heads, suitably connected at the level of the head apparatus; in particular, a first probe is used to carry a signal from a first contact pad of the device under test towards the testing apparatus and the signal is closed again by itself on a second contact pad of the device under test via a second contact probe.

However, it occurs that the distance travelled by the signal from the device under test to the testing apparatus and vice versa causes a reduction in frequency performance of the testing head as a whole.

Furthermore, the desire to improve the frequency performance of a testing head persists in the field.

A probe having an impedance matching function and capable of coping with a narrow pitch arrangement is known from the Japanese Patent Publication No. JP 2014 112046 in the name of Micronics Japan Co. Ltd. Other known probe heads are disclosed in the US Patent Publication No. US 2014/0062519 in the name of Ding et al. (IBM) and in the Korean Patent Publication No. KR 101 421 051 in the name of Will Technology Co. Ltd.

BRIEF SUMMARY

The testing head for testing electronic devices is capable of easily reducing, if not eliminating, the interference and, therefore, the noise due to the presence of ground and power contact probes, also in case of numerous power signals different from each other, and of allowing reducing signal paths in case of contact pads that should be short-circuited, so overcoming the limitations and drawbacks which still nowadays affect the testing heads made according to the prior art.

According to an aspect of the disclosure the testing head includes guides which have at least one conductive zone to short-circuit a plurality of probes intended to carry one same signal, like a common conductive plane, as well as contact probes intended to carry other signals, at least partially covered with insulating material so as to be insulated from common conductive plane.

More particularly, the testing head intended to verify the functionality of a device under test integrated on a semi-conductor wafer comprises at least one guide provided with a plurality of guide holes and at least a first group of contact probes and a second group of contact probes housed in said plurality of guide holes, each of such contact probes comprising a body extending between a first end region and a second end region, the testing head being characterized in that at least one guide comprises at least one conductive portion which includes at least one group of the housing guide holes, the conductive portion electrically connecting the contact probes of the first group that slide in the housing guide holes realized therein and are adapted to carry a same signal and in that each of the contact probes of the second group comprises a coating layer made of insulating material formed at the body, so as to insulate the contact probes of the second group from the conductive portion.

According to another aspect of the disclosure, the conductive portion can be connected to a common signal reference selected from a ground reference, a power reference, or an operating signal reference.

In particular, such conductive portion can be formed at a face of the body.

Furthermore, such conductive portion can comprise an orthogonal portion extending at least partially within the housing guide holes.

According to another aspect of the disclosure, the conductive portion can entirely cover the guide.

Alternatively, the conductive portion can be formed by a completely conductive guide.

According to this aspect of the disclosure, the completely conductive guide can be selected from an upper guide, a lower guide or an additional guide of the testing head.

According to another aspect of the disclosure, the coating layer can be in the form of a thin film, with thickness lower than 2 µm, preferably lower than 0.2 µm.

Furthermore, the coating layer can be made of an insulating material selected from an organic or polymeric insulating material, preferably a high hardness insulating material selected from a nitride, aluminum oxide (or alumina) or the so called diamond-like carbon (DLC).

Furthermore, the coating layer can extend throughout the contact probe of the second group, except for the end regions.

Alternatively, the coating layer can solely extend in a portion of the body of the contact probes of the second group, such portion being that intended to be housed in a corresponding housing guide hole during the working of the testing head.

According to another aspect of the disclosure, the conductive portion can be made of conductive material, preferably a metallic material selected from copper, gold, silver, palladium, rhodium and alloys thereof.

Still according to another aspect of the disclosure, the guide can be placed close to the device under test.

Finally, according to another aspect of the disclosure, the testing head can comprise further circuital components, preferably filtering elements, such as capacitors, electrically connected to the conductive portion.

The characteristics and advantages of the testing head according to the disclosure will be apparent from the description, made hereafter, of an embodiment thereof, given by indicative and non-limiting example, with reference to the accompanying drawings.

BRIEF DESCRIPTION OF THE SEVERAL VIEWS OF THE DRAWINGS

FIGS. 3A and 3B schematically show a contact probe included in a testing head according to the present disclosure.

DETAILED DESCRIPTION

Figure 1:
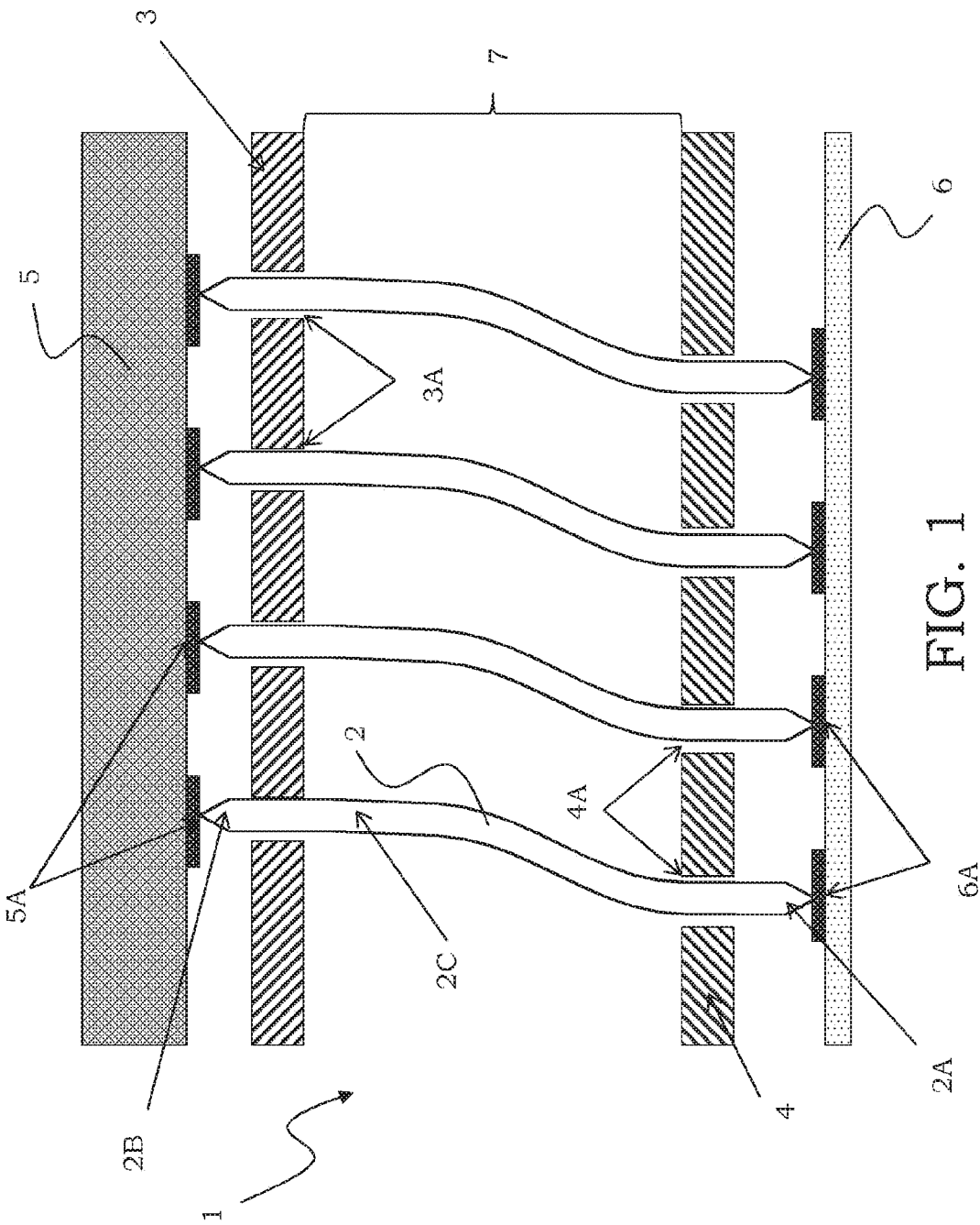
FIG. 1 schematically shows a testing head made according to the prior art.
Figure 2:
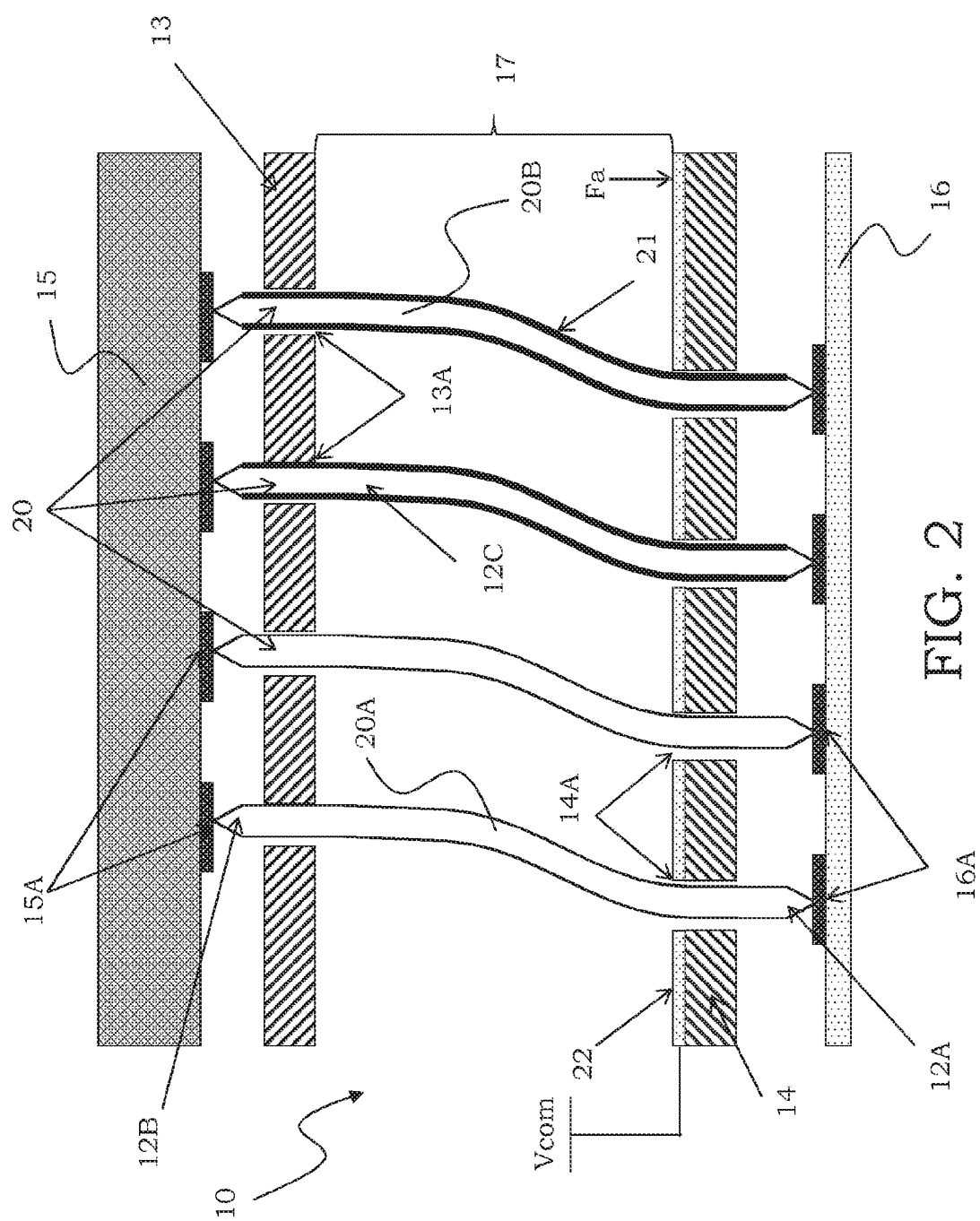
FIG. 2 schematically shows a testing head made according to the present disclosure.

With reference to such figures, and in particular to FIG. 2, reference number 10 globally indicates a testing head provided with a plurality of contact probes for testing electronic devices, in particular integrated on wafer.

It should be noted that the figures are schematic views of the testing head according to the disclosure and are not drawn to scale, but instead they are drawn so as to enhance the important features of the disclosure. Furthermore, in the figures, the different elements are schematically shown, since their shape can vary according to the desired application. It should also be noted that in the figures identical reference numbers refer to elements identical in shape or function. Finally, the different aspects of the disclosure shown by way of example in the figures can be combined with each other and are interchangeable from one embodiment to another.

In particular, the testing head 10 is of the type with unconstrained vertical probes and comprises furthermore a plurality of contact probes 20 housed in at least one upper guide 13, usually indicated by "upper die", and in a lower guide 14, usually indicated by "lower die", plate-shaped and parallel to each other, separated by an air zone 17. The upper guide 13 and the lower guide 14 comprise respective housing guide holes 13A and 14A within which the contact probes 20 slide.

Each contact probe 20 has an end zone or region ending with a contact tip 12A intended to abut against a respective pad or contact pad 16A of a plurality of contact pads of a device under test 16 integrated on a semiconductor wafer, so as to form the mechanical and electric contact between the device under test 16 and a testing apparatus (not shown) which such testing head is an end element of.

Each contact probe 20 also has a further end zone or region ending with a so-called contact head 12B towards a respective pad or contact pad 15A of a plurality of contact pads of a space transformer 15.

The contact probes 20 are usually made of wires of special alloys with good electric and mechanical properties, preferably of a metallic nickel alloy, in particular a NiMn or NiCo alloy.

Suitably, according to the present disclosure, the testing head 10 comprises at least one first group of contact probes, indicated by 20A and a second group of contact probes, indicated by 20B, each contact probe 20B of such second group also comprising at least one coating layer 21 made of an insulating material, preferably hard. In particular, the insulating material of the coating layer has a Vickers hardness higher than 2,000 HV (19614 MPa).

Furthermore, the testing head 10 according to the present disclosure comprises at least a conductive portion 22 covering at least a zone, preferably the entire surface, of one of such guides, for example lower guide 14, at one face thereof, for example an upper face Fa taking into account the local reference of FIG. 2. Substantially, the upper face Fa of the lower guide 14 is that located at the air zone 17, facing towards the upper guide 13.

The lower guide 14 can be made of a non-conductive material, for example a ceramic material such as silicon nitride or a vitreous or silicon-based material, or a polyamide material, or any other suitable dielectric material, whereas the conductive portion 22 can be made for example in the form of a metallization layer deposited on the guide and photolithographically or by laser defined. Furthermore, such conductive portion 22 can be made of any conductive material, such as a metallic material, in particular selected from copper, gold, silver, palladium, rhodium and allays thereof, to mention but a few.

More in particular, the conductive portion 22 extends over an area from the lower guide 14 including more housing guide holes 14A of the contact probes 20; in this way, the conductive portion 22, which includes the housing guide holes 14A is able to electrically connect the contact probes 20 inserted therein and forms a common conductive plane for the probes, which plane can be suitably connected to a same signal, such as a common voltage reference, selected from a power or ground voltage reference or an operating signal, that is an input/output signal used for testing the device under test 16. In particular, the conductive portion 22 extends along the rim of the housing guide holes 14A and it would thus contact the contact probes 20 sliding therethrough.

It is thus possible to use the conductive portion 22 to connect a plurality of contact probes 20 and such same signal, indicated as Vcom common signal. Vcom also indicates a common signal reference connected to the conductive portion 22.

Advantageously according to the present disclosure, the testing head 10 furthermore comprises the first group of contact probes 20A which are short-circuited to each other and are connected to the Vcom common signal thanks to the conductive portion 22 as well as the second group of contact probes 20B which are isolated from this conductive portion 22 thanks to the coating layer 21 and are therefore not connected to the Vcom common signal. In other words, the coating layer insulates the contact probes 20B of the second group from the conductive portion 22.

More in particular, such coating layer 21 can extend throughout the contact probe 20B, except for the respective tip end regions 12A and head end regions 12B, that is along a rod-like body 12C of such contact probe 20B defined between such end regions, as illustrated in FIG. 3A.

Alternatively, the coating layer 21 can solely extend in a portion 12D of the body 12C of the contact probe 20B, such portion 12D being that intended to be housed in the corresponding housing guide hole 14A of the lower guide 14 during the working of the testing head 10, both at rest and when the contact probes 20 rest on the contact pads 16A of the device under test 16 and therefore the probes slide in the housing guide holes 14A. In other words, the portion 12D of the body 12C covered by the coating layer 21 is that which can come into contact with the conductive portion 22 during the working of the testing head 10. In this way the insulation of the contact probe 20B is ensured from such conductive portion 22 thanks to the presence of the coating layer 21.

More in particular, the coating layer 21 can be in the form of a thin film, with a thickness lower than 2 μm, preferably lower than 0.2 μm. It is possible to form such a coating layer 21 by a so-called flash deposition on the contact probe 20 of the insulating material, and subsequent etching thereof at the areas which do not require insulation, in particular tip portions 12A and head portions 12B of the contact probe 20, leaving the thin or flash layer of insulating material solely at the body 12C or a portion of it.

More in particular, the coating layer 21 is made of an insulating material selected from a polymeric or organic insulating material, preferably a high hardness insulating material selected from nitride, aluminium oxide (or alumina) or the so-called diamond-like carbon (DLC). In particular, the insulating material of the coating layer has a Vickers hardness between 2,000 and 10,000 HV (between 19614 and 98070 MPa).

As explained, the testing head 10 comprises contact probes intended to carry different types of signals, in particular power signals, ground signals and operating signals, that is input/output signals from/to a device under test.

It is underlined that contact probes intended to carry different types of signals can be distinguished from each other also based upon different physical and mechanical features, which take into account for example that the power signals can also exhibit high current values, usually in the order of 1 A or more, whereas the operating signals, that is input/output signals, usually exhibit lower current values, for instance in the order of 0.5 A or less. In case of contact probes in the form of metallic wires for example, it is possible to use wires with different diameter for probes intended to carry different types of signals; in particular it is possible to form probes for high current power signals with wires with diameter higher with respect to the wires forming the probes for carrying the operating signals, that is input/output signals; it is also possible to use different materials for the probes carrying different types of signals.

As explained with respect to the prior art, the presence of many contact probes intended to carry ground signals as well as power signals, causes interference, resulting in a noise in the operating signals, that is input/output signals used to verify the device under test, that limits the performance of the testing head as a whole, in particular the frequency performance.

Advantageously according to the present disclosure, the presence of the conductive portion 22, which allows electrically connecting at least one group of contact probes 20A, for example intended to carry ground signals forming thus a common (ground) conductive plane, it allows nullifying the noise in the signals carried by other contact probes within testing head 10, in particular for probes intended to carry operating signals, that is input/output signals, such probes being suitably provided with a coating layer 21 like the probes 20B in FIG. 2.

This way the testing head 10 can comprise contact probes intended to carry ground and power signals, as well as contact probes intended to carry input/output signals, which are housed in the guides in any combination, the probes which must not be in contact with the conductive portion 22 being suitably provided with the coating layer 21.

Advantageously according to the present disclosure, the conductive portion 22, can completely cover the lower guide 14 and should not be shaped so as to short-circuit only the probes involved in the transport of the same type of signal, for example a power signal, significantly facilitating the formation of such a conductive portion 22 and of the testing head 10 as a whole also in case of probes intended to carry such a signal, for example power signal, not adjacent to each other, as occurs in the most recent topologies of circuits integrated on wafer.

It is underlined that is possible to consider a testing head 10 wherein all the contact probes 20A carrying similar signals, for example power signals, are electrically connected via the conductive portion 22, or a testing head 10 wherein only some of them are short-circuited by such conductive portion 22.

Furthermore, the conductive portion 22 may be formed so as to comprise guide holes of contact probes abutting against contact pads which should be short-circuited to each other, such short-circuit being formed exactly by means of such contact probes and the conductive portion 22, indeed.

It is underlined that, in that case, advantageously according to the present disclosure, the signal carried by the contact probes which are connected by the conductive portion 22 is not carried to the testing apparatus and then again to the device under test, but it closes itself again at the guide provided with the conductive portion 22, according to a lower path with respect to the known solutions; particularly advantageous is the case illustrated wherein the conductive portion 22 is formed on the lower guide, that is to say close to the device under test, so as to enhance the electric performance of the short-circuit formed in this way.

Advantageously according to the present disclosure, it is also possible to provide the testing head 10 with further circuital components connected to the conductive portion 22 forming a common conductive plane.

Figure 4A:
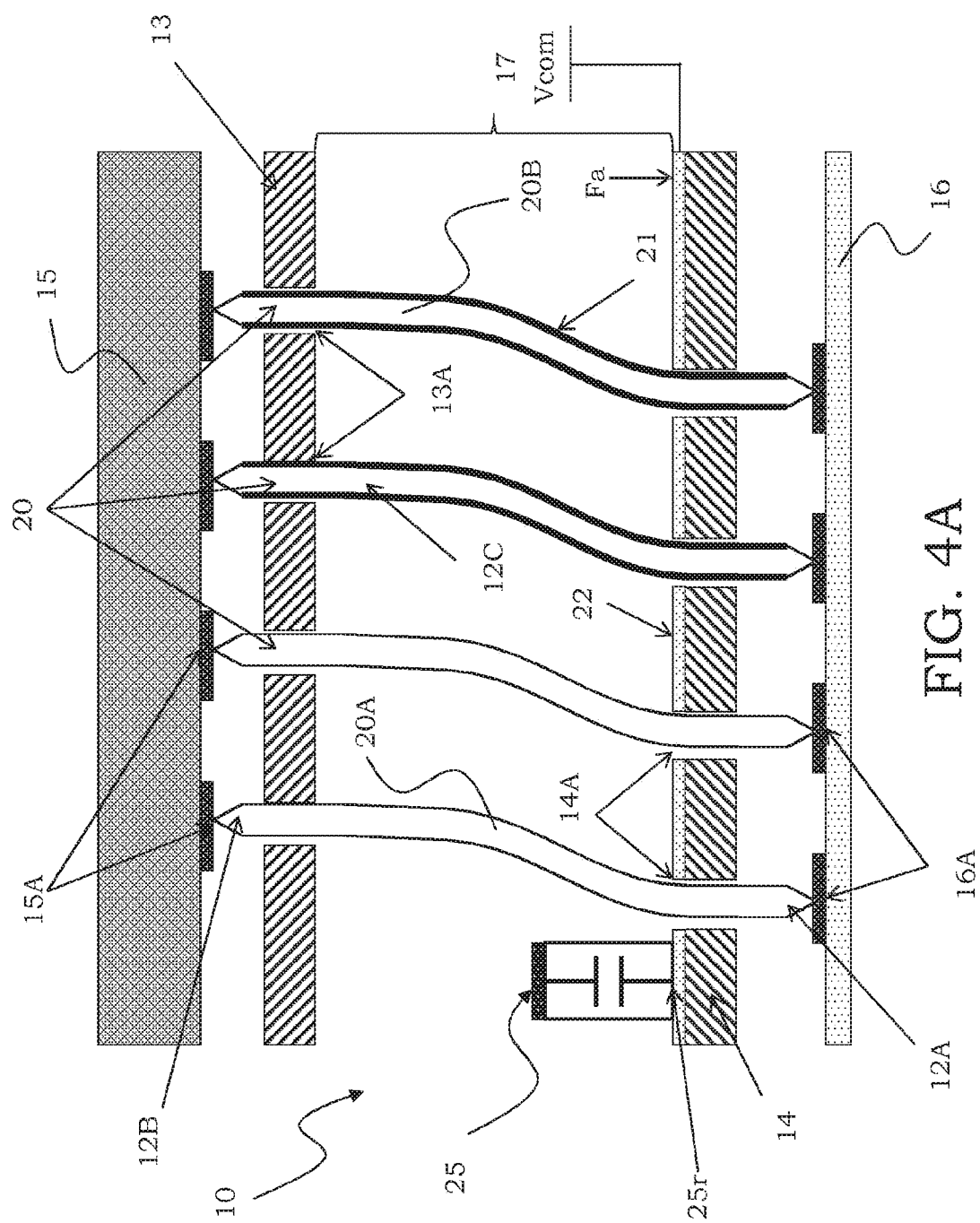
FIGS. 4A-4D and 5A-5B schematically show alternative embodiments of the testing head according to the present disclosure.

For example, it is possible to insert suitable filtering elements, in particular filtering capacitors 25, having at least one rheophore 25r connected to the conductive portion 22 forming a common conductive plane, as schematically shown in FIG. 4A. It would be likewise possible to connect to such a common conductive plane other circuital components, such as a resistor or an inductor for example, suitably connected to the conductive portion 22.

It is underlined that the embodiment of FIG. 4A is capable of optimizing the filtering effect of such filtering capacitors 25, and therefore of minimizing the interference caused by the contact probes carrying ground and power signals, since such filtering capacitors 25 are placed as close as possible to the contact tips 12A of the contact probes, the conductive portion 22 being formed in the lower guide 14, that is to say close to the wafer comprising the device under test 16.

Figure 4B:
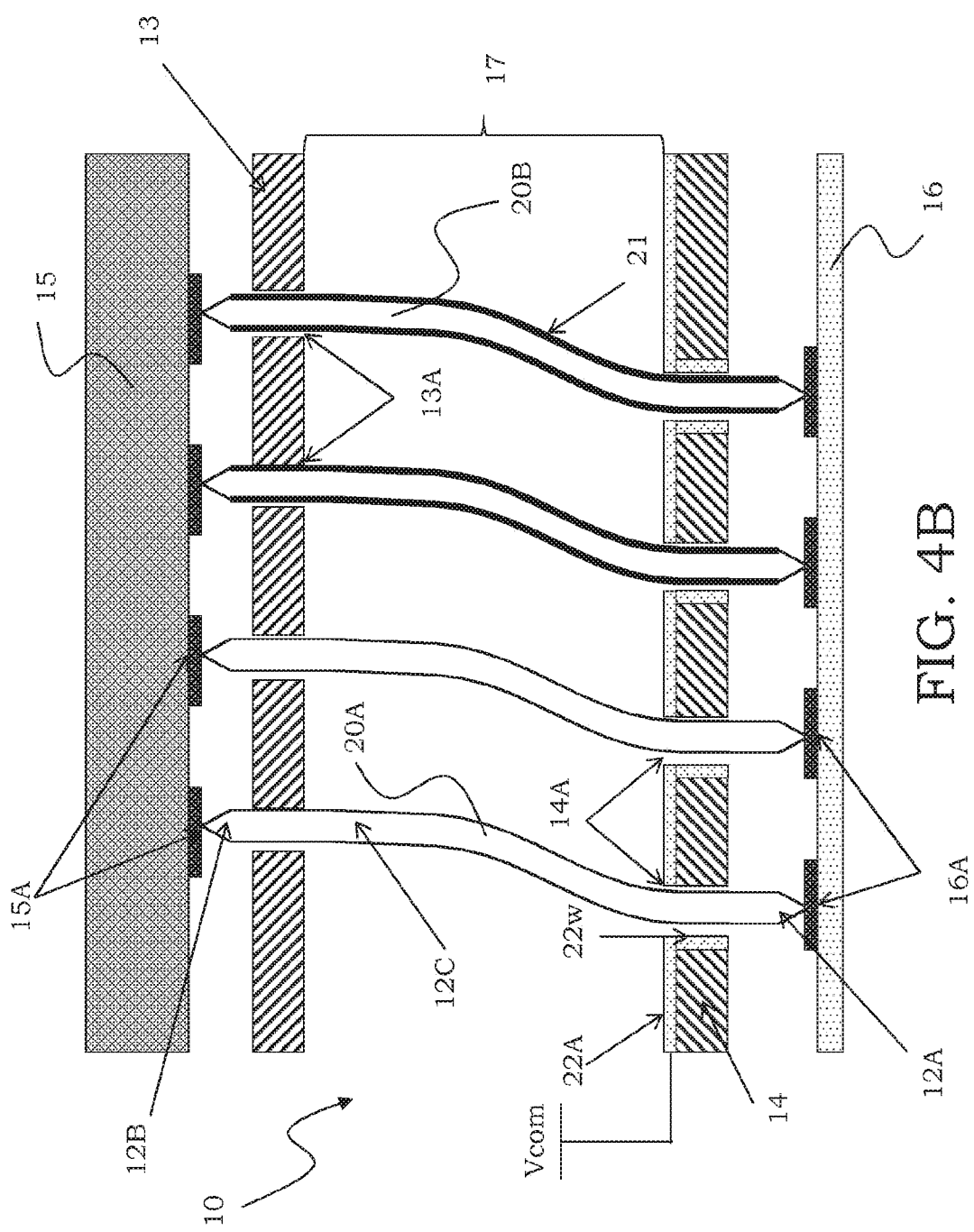

Suitably, the conductive portion 22 can also extend within the housing guide holes 14A of the contact probes 20, in particular also having an orthogonal portion 22w covering at least partially an inner wall of such housing guide holes 14A, as schematically illustrated in FIG. 4B.

However, it is underlined that, even in case the conductive portion 22 does not cover the inner wall of the guide holes, the contact with the contact probes 20A is however guaranteed by the thickness of the conductive portion 22 itself on which such probes slide.

Figure 4C:
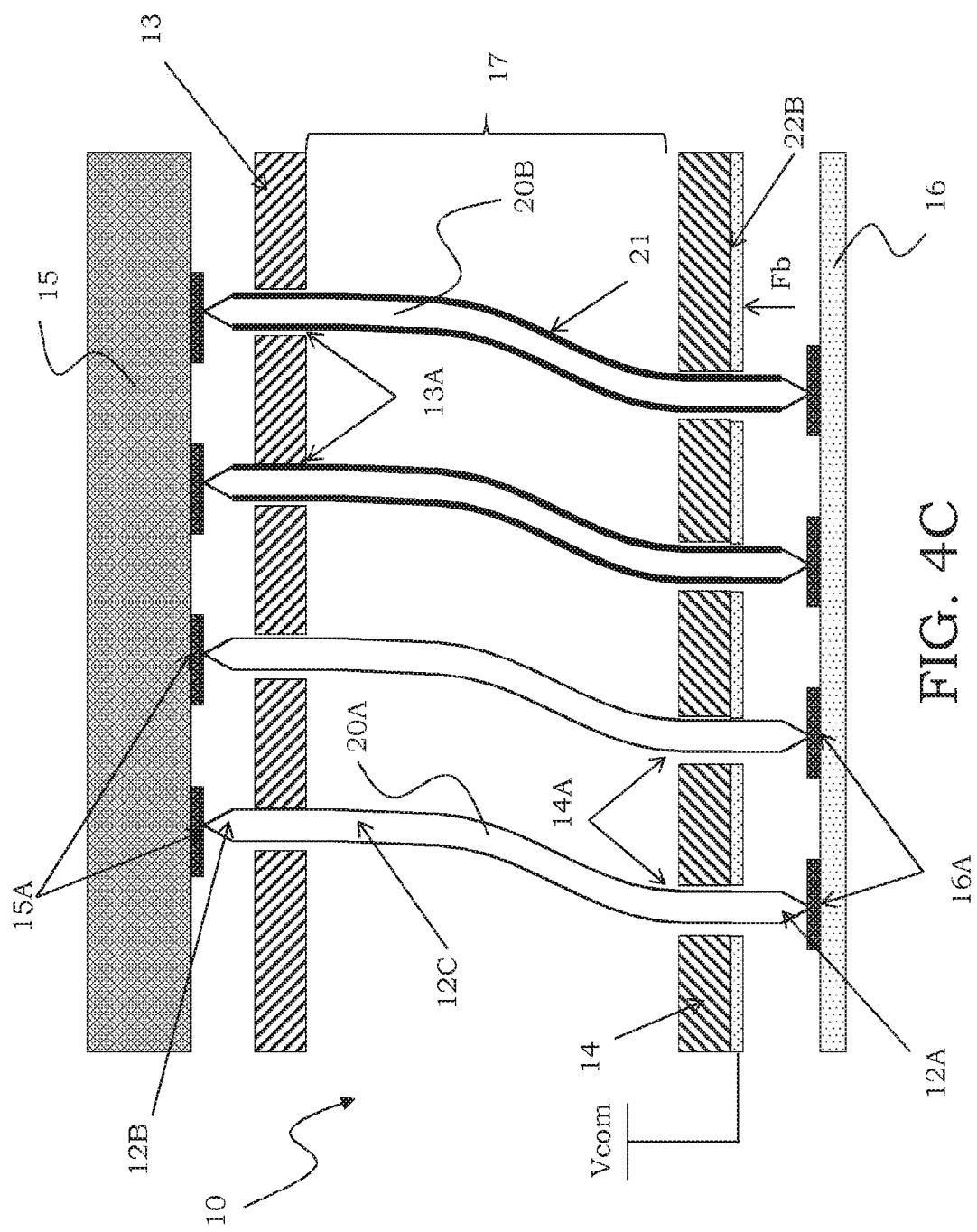

It is also possible to form the conductive portion 22 at a second and opposite face of the lower guide 14, as schematically illustrated in FIG. 4C, for example a lower face Fb considering the local reference of such figure. Substantially, the lower face Fb of the lower guide 14 is that facing towards the device under test 16.

It is also possible to consider whether to form respective conductive portions on both faces Fa and Fb of the lower guide 14.

Figure 4D:
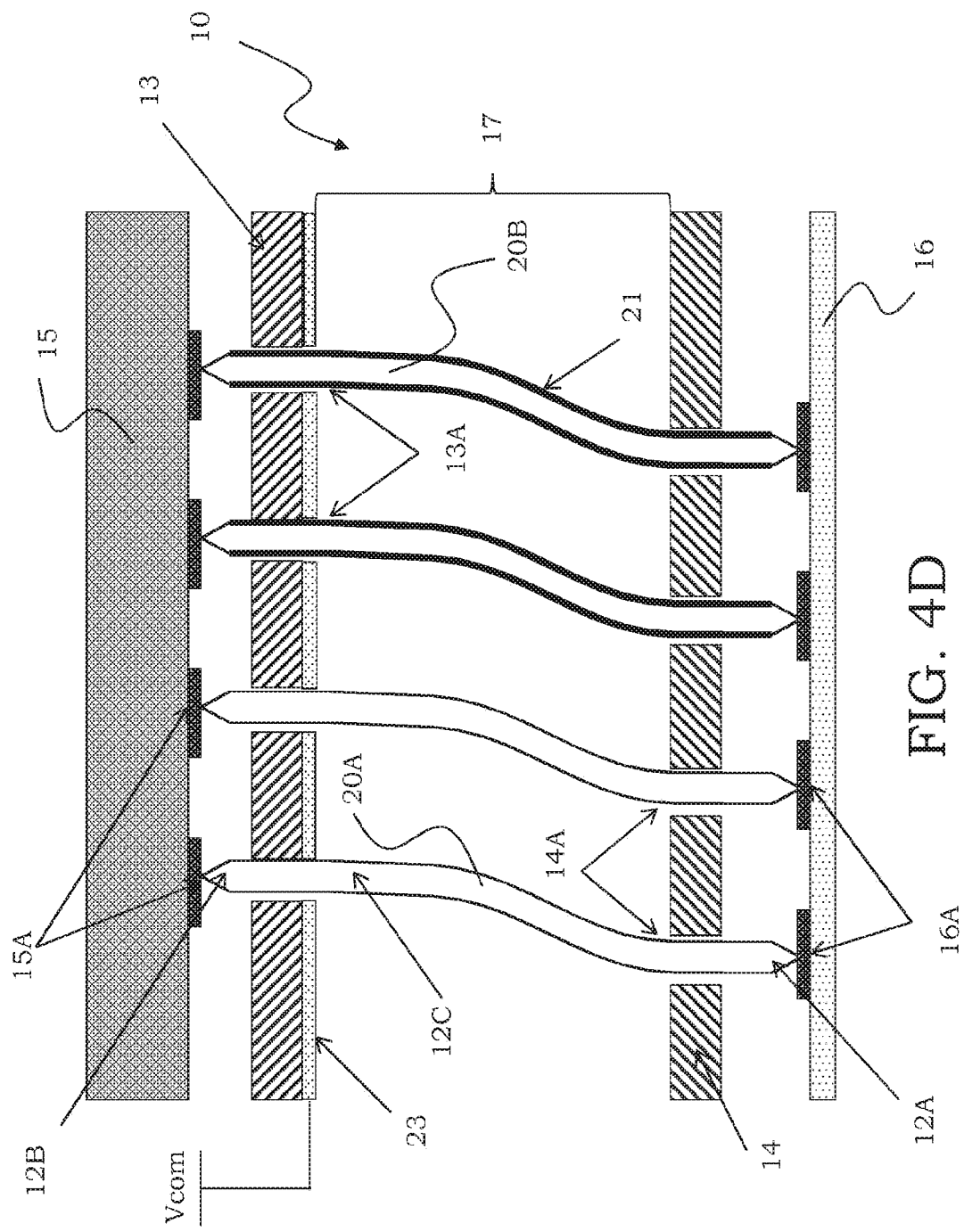

Furthermore, as schematically illustrated in FIG. 4D, it is possible to form the testing head 10 so as to comprise a conductive portion 23 formed on the upper guide 13. Also in that case, the conductive portion 23 extends over an area from the upper guide 13 including multiple housing guide holes 13A of the contact probes 20; in this way, the conductive portion 23, which includes the housing guide holes 13A is able to electrically connect the contact probes 20 inserted therein and forms a common conductive plane, which can be connected to a Vcom common signal, in particular selected from a supply voltage reference, a ground reference or an operating signal that is an input/output signal, so as to connect a plurality of contact probes 20 and such Vcom common signal. Also in that case, the conductive portion 23 can substantially extend on the entire surface of the upper guide 13 and connect therefore all the housing guide holes 13A formed therein, the contact probes 20B which must be insulated by such conductive portion 23, and are not connected to such Vcom common signal, since they are provided with the coating layer 21.

As previously, such coating layer 21 can extend throughout the contact probe 20B, except for the respective tip end regions 12A and head end region 12B, that is along its rod-like body 12C or extend solely in a portion of such body 12C intended to be housed in the corresponding housing guide hole 13A of the upper guide 13 during the working of the testing head 10, both at rest and when the contact probes 20 rest on the contact pads 16A of the device under test 16, so as to guarantee the insulation of the contact probe 20B from such conductive portion 23 thanks to the presence of the coating layer 21.

Such conductive portion 23 can be formed on an upper face Fa or on a lower face Fb of the upper guide 13, still considering the local reference of the figure or can be arranged on both faces Fa and Fb.

Figure 5A:
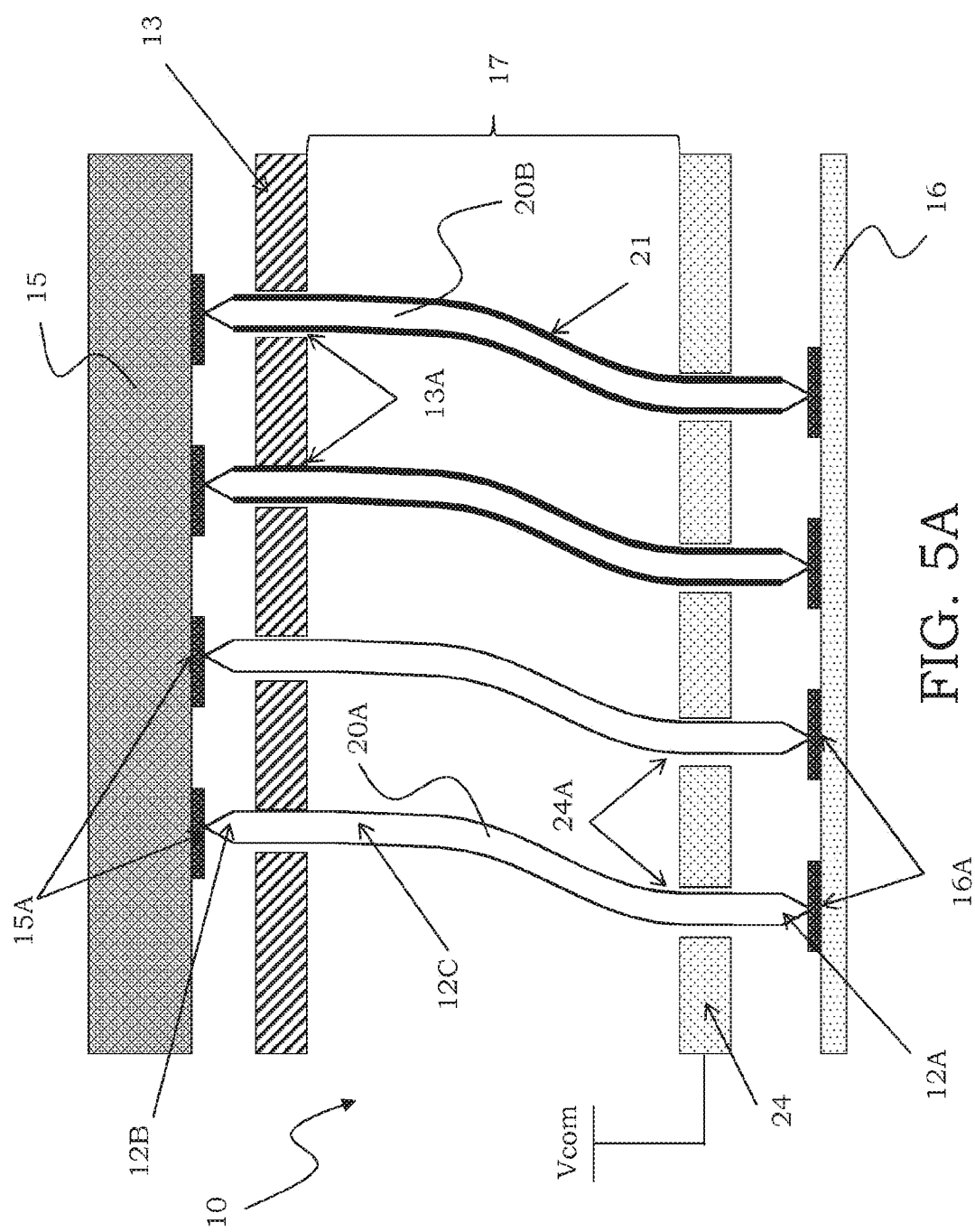

In an alternative embodiment, schematically illustrated in FIG. 5A, the testing head 10 comprises at least one guide or die, for example the lower guide, completely made of conductive material and generally indicated by 24. Such conductive guide 24 comprises a plurality of housing guide holes 24A of the contact probes 20. It is obviously possible to form the upper guide 13 completely made of conductive material.

Similarly, to the conductive portion 22, the conductive guide 24 electrically connects the contact probes 20 inserted in the housing guide holes 24A formed therein and forms a common conductive plane, and can be connected to a Vcom common signal, selected from a power voltage reference or a ground voltage reference or an operating signal that is an input/output signal, so as to connect a plurality of contact probes 20 and such Vcom common signal.

As previously, the testing head 10 comprises a first group of contact probes 20A short-circuited by such conductive guide 24 and a second group of contact probes 20B suitably covered by a coating layer 21 and therefore insulated with respect to the conductive guide 24.

Also in that case, the coating layer 21 can completely cover the body 12C of the contact probe 20B or a portion of it housed in a corresponding housing guide hole 24A formed in the conductive guide 24, so as to guarantee the proper insulation of such contact probe 20B with respect to the conductive guide 24 and to the common voltage reference to which such conductive guide 24 can be connected.

Figure 5B:
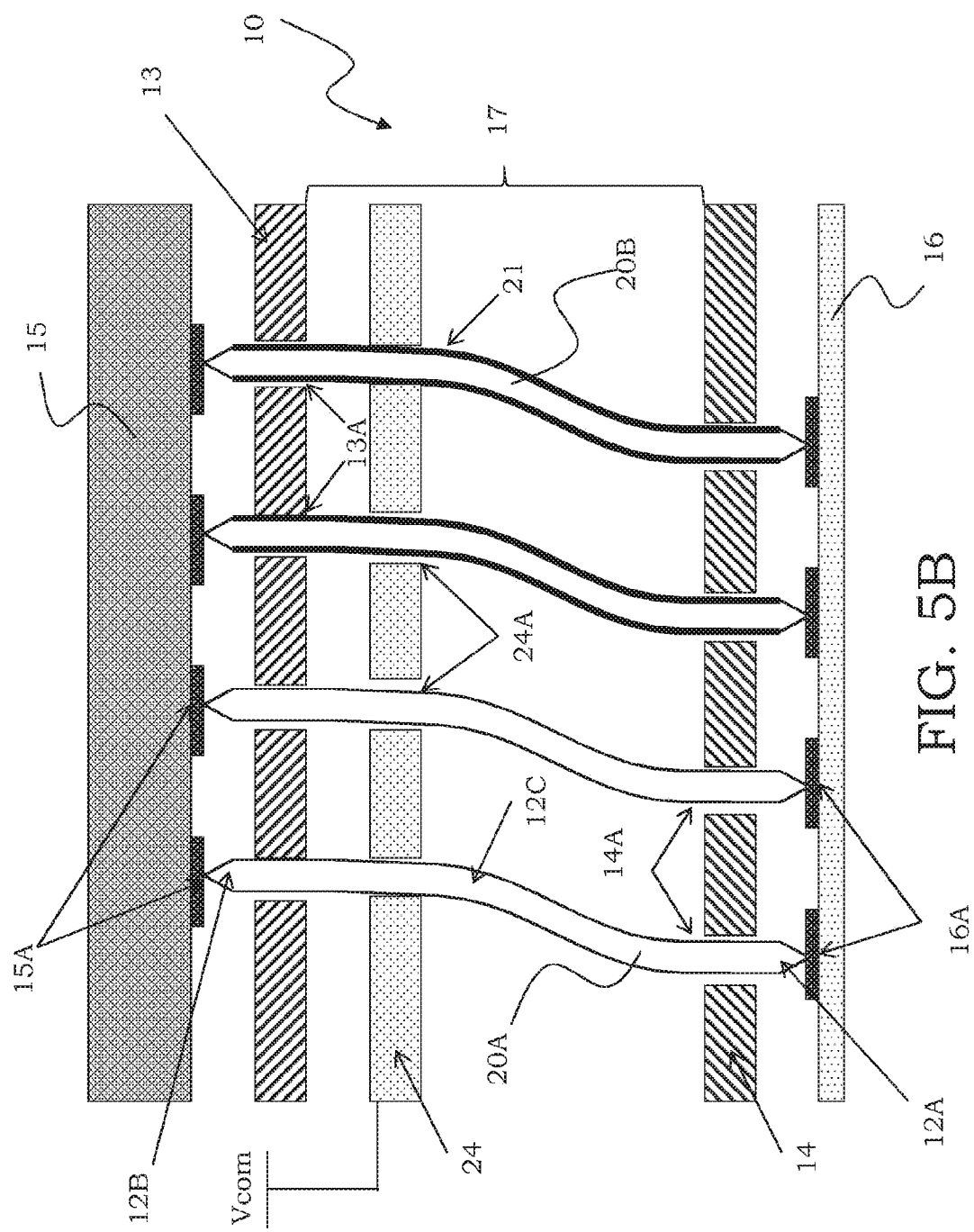

Alternatively, as illustrated in FIG. 5B, the testing head 10 can comprise an upper guide 13 and a lower guide 14, plate-shaped and parallel to each other, separated by an air zone 17 and provided with respective housing guide holes 13A and 14A within which the contact probes slide and a further guide, which is completely made of conductive material and generally indicated by 24. Such conductive guide 24 comprises a plurality of housing guide holes 24A of the contact probes 20.

In conclusion, the testing head according to the disclosure allows electrically connecting a plurality of contact probes carrying a same signal, in particular a power signal, a ground signal or an operating signal, that is an input/output signal, thanks to a conductive portion substantially extending throughout a guide or which is formed by the guide itself if conductive and which is connected to such common signal, ensuring in the meanwhile the insulation of the other contact probes included in the testing head and suitably provided with a non-conductive coating layer.

It is possible in this way to significantly reduce, if not nullify, the noise in the signal derived from the different power or ground references, since the conductive portion of the guide or the guide itself forms a conductive plane common to all the conductive probes carrying such a power or ground reference.

It is also possible to use the conductive portion of the guide or the guide itself to short-circuit two contact pads of a device under test, minimizing the path of the signal between them and enhancing therefore the frequency performance of the testing head as a whole.

Furthermore, the chance to short-circuit the ground contact probes and power contact probes allows enhancing the current performance of the testing head of the present disclosure, also avoiding possible burnings of such contact elements.

Moreover, the testing head does not need complicated configurations of the conductive portion, which can entirely cover a guide and must not be cut out in case of probes intended to carry different signals, in particular power, ground or operating signals, alternating also according relatively complex patterns.

It is finally possible to obtain a testing head with improved performance in terms of filtering the signals, in particular the ground and power references and as such capable of enhancing the frequency performance housing suitable capacitors electrically connected to the portion or to the conductive guide.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A testing head comprising:
a plurality of vertical contact probes, each vertical contact probe comprising:
a first end region and a second end region; and
a body which extends between the first end region and the second end region;
a first guide including a plurality of first housing guide holes to house the plurality of vertical contact probes; and
a second guide including a plurality of second housing guide holes to house the plurality of vertical contact probes, the second guide being separated by an air zone from the first guide, and
wherein the first guide comprises at least one conductive portion at least partially lying on one face of the first guide,
wherein the at least one conductive portion extends to a respective rim of each of the plurality of first housing guide holes of the first guide, the at least one conductive portion electrically connects and directly contacts an outer metal periphery of vertical contact probes of a first group of the plurality of vertical contact probes at respective rims of respective ones of the plurality of first housing guide holes housing the first group of the plurality of vertical contact probes, the vertical contact probes of the first group sliding in respective ones of the plurality of first housing guide holes realized in the at least one conductive portion and being adapted to carry a same signal, and
wherein each vertical contact probe of a second group of the plurality of vertical contact probes is surrounded by a coating layer made of an insulating material, the coating layer covering less than half of each vertical contact probe of the second group, and the coating layer extending along the body of each vertical contact probe of the second group, the coating layer insulating the vertical contact probes of the second group from the at least one conductive portion at the respective rims of respective ones the plurality of first housing guide holes of the first guide, the coating layer forming outer periphery sections of the vertical contact probes of the second group and sized to fit through respective ones of the plurality of first housing guide holes.

2. The testing head of claim 1, wherein the at least one conductive portion is configured to be connected to a common signal reference selected from a ground reference, a power reference, or an operating signal reference.

3. The testing head of claim 1, wherein the at least one conductive portion comprises an orthogonal portion which extends at least partially within the plurality of first housing guide holes of the first guide, the orthogonal portion being electrically connected to the at least one conductive portion at respective rims at each of the plurality of first housing guide holes of the first guide.

4. The testing head of claim 1, wherein the at least one conductive portion entirely covers the face of the first guide.

5. The testing head of claim 4, wherein the face is an exterior face of the first guide that faces away from the second guide.

6. The testing head of claim 4, wherein the face is an interior face of the first guide that faces towards the second guide.

7. The testing head of claim 1, wherein the coating layer is a thin film having a thickness of less than 2 µm.

8. The testing head of claim 1, wherein the coating layer is made by an insulating material selected from a polymeric or an organic insulating material.

9. The testing head of claim 1, wherein the coating layer is made by an insulating material that has a high hardness and is selected from a nitride, aluminium oxide, alumina, and diamond-like carbon.

10. The testing head of claim 1, wherein the conductive portion is only on the one face and the one face is an interior face of the first guide.

11. The testing head of claim 1, wherein the coating layer covering less than half of each vertical contact probe of the second group extends only along a section of the body of each vertical contact probe of the second group, the section being one to be housed in a corresponding one of the plurality of first housing guide hole of the first guide during a normal working of the testing head.

12. The testing head of claim 1, wherein the conductive portion is made of a metallic material selected from copper, gold, silver, palladium, rhodium and their alloys.

13. The testing head of claim 1, wherein the first guide is in proximity to a device under test (DUT) and comprises circuital components electrically connected to the at least one conductive portion.

14. The testing head of claim 13, wherein the circuital components are filtering elements.

15. The testing head of claim 1, wherein the coating layer is a thin film having a thickness of less than 2 µm and made by an insulating material selected from a polymeric or an organic insulating material.

16. A testing head comprising:
a plurality of vertical contact probes, each vertical contact probe comprising:
a first end region and a second end region; and
a body which extends between the first end region and the second end region;
a first guide including a plurality of first housing guide holes to house the plurality of vertical contact probes; and
a second guide including a second plurality of guide housing holes to house the plurality of vertical contact probes, and
wherein the first guide comprises at least one conductive portion only on an exterior face of the first guide, the exterior face of the first guide faces away from the second guide,
wherein the at least one conductive portion extends to a respective rim of each of the plurality of first housing guide holes of the first guide, the at least one conductive portion electrically connects and directly contacts an outer metal periphery of vertical contact probes of a first group of the plurality of vertical contact probes at the respective rims of respective ones of the plurality of first housing guide holes of the first guide, the vertical contact probes of the first group sliding in respective ones of the plurality of first housing guide holes realized in the at least one conductive portion and being adapted to carry a same signal,
wherein each vertical contact probes of a second group of the plurality of vertical contact probes is at least partially surrounded by a coating layer made of an insulating material and extending along the body of each vertical contact probe of the second group, the coating layer insulating the vertical contact probes of the second group from the at least one conductive portion at respective rims of the plurality of first housing guide holes of the first guide, the coating layer forming an outer periphery of the vertical contact probes of the second group and sized to fit through respective ones of the plurality of first housing guide holes.

17. The testing head of claim 16, wherein the at least one conductive portion entirely covers the exterior face of the first guide.

18. The testing head of claim 16, wherein the coating layer extends along the whole body of each vertical contact probe of the plurality of vertical contact probes of the second group.

19. The testing head of claim 16, wherein the coating layer extends only in a section of said body of each vertical contact probe of the second group, the section being one to be housed in a corresponding one of the plurality of first housing guide holes or the plurality of second guide holes of the first guide or the second guide during a normal working of the testing head.

20. The testing head of claim 16, wherein the conductive portion is made of a metallic material selected from copper, gold, silver, palladium, rhodium and their alloys.

21. The testing head of claim 16, wherein the first guide is in proximity to a device under test (DUT) and comprises circuital components electrically connected to the at least one conductive portion.

22. The testing head of claim 21, wherein the circuital components are filtering elements.

23. A testing head comprising:
a plurality of vertical contact probes, each vertical contact probe comprising:
a first end region and a second end region; and
a body which extends between the first end region and the second end region; and
a first guide including a plurality of first housing guide holes in which the plurality of vertical contact probes are housed;
a second guide including a plurality of second housing guide holes in which the plurality of vertical contact probes are housed, the second guide is separated from the first guide by an air zone between the first and second guides;
a conductive guide between the first guide and the second guide, the conductive guide including a plurality of third housing guide holes in which the plurality of vertical contact probes are housed; and
wherein the conductive guide electrically connects and directly contacts an outer metal periphery of vertical contact probes of a first group of the plurality of vertical contact probes at respective rims of respective ones of the plurality of third housing guide holes, the vertical contact probes of the first group sliding in respective ones of the plurality of third housing guide holes realized in the conductive guide and being adapted to carry a same signal, and wherein each vertical contact probe of a second group of the plurality of vertical contact probes is surrounded by a coating layer made of an insulating material and extending along the body of each vertical contact probe of the second group, the coating layer insulating the vertical contact probes of the second group from the conductive guide at respective rims of respective ones of the plurality of third housing guide holes, the coating layer forming an outer periphery of the vertical contact probes of the second group and sized to fit through respective ones of the plurality of third housing guide holes.

24. The device of claim 23, wherein the coating layer is a thin film having a thickness of less than 2 μm.

25. The device of claim 23, wherein the coating layer is made of an insulating material selected from a polymeric or an organic insulating material.

* * * * *